US012666939B2

(12) United States Patent
Lin et al.

(10) Patent No.: US 12,666,939 B2
(45) Date of Patent: Jun. 23, 2026

(54) SEMICONDUCTOR STRUCTURE AND FABRICATION METHOD THEREOF

(71) Applicant: UNITED MICROELECTRONICS CORP., Hsin-Chu City (TW)

(72) Inventors: Chu-Fu Lin, Kaohsiung City (TW); Chuan-Lan Lin, Chiayi City (TW); Yu-Ping Wang, Hsinchu City (TW); Chun-Hung Chen, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 387 days.

(21) Appl. No.: 18/423,309

(22) Filed: Jan. 26, 2024

(65) Prior Publication Data

US 2025/0218902 A1     Jul. 3, 2025

(30) Foreign Application Priority Data

Dec. 29, 2023     (TW) .................................. 112151477

(51) Int. Cl.
*H01L 23/48*          (2006.01)
*H01L 23/52*          (2006.01)
(Continued)

(52) U.S. Cl.
CPC ......... *H10W 20/20* (2026.01); *H10W 20/023* (2026.01); *H10W 90/00* (2026.01);
(Continued)

(58) Field of Classification Search
CPC ... H10W 20/20; H10W 90/00; H10W 20/023; H10W 72/952; H10W 90/297; H10W 80/327; H10W 90/722; H10W 90/734; H10W 72/29; H10W 72/923; H10W 70/60; H10W 72/942; H10W 90/754; H10W 20/081; H10W 20/40; H10W 80/00; H10W 70/614; H10W 20/2134; H10W 10/17; H10W 90/20; H10W 20/021; H10W 20/076; H10W 90/401; H10W 74/147; H10W 90/291; H10W 90/22; H10W 90/24; H10W 90/28; H10W 72/347; H10W 90/794; H10W 20/217; H10W 70/099; H10W 72/07232; H10W 72/9226; H10W 80/211; H10W 70/63; H10W 20/0253;
(Continued)

(56) References Cited

U.S. PATENT DOCUMENTS 9,064,940 B2     6/2015   Chen
2023/0307322 A1*   9/2023   Chuang ................. H10W 20/20

FOREIGN PATENT DOCUMENTS

EP              3255664 A1 *  12/2017   ............ H10W 80/00

* cited by examiner

*Primary Examiner* — Niki H Nguyen
(74) *Attorney, Agent, or Firm* — Winston Hsu

(57) ABSTRACT

A semiconductor structure includes a bottom wafer having a bottom substrate and a bottom interconnect structure on the bottom substrate, and a top wafer having a top substrate with a front surface and a rear surface and a top interconnect structure disposed on the front surface of the top substrate. The top interconnect structure is directly bonded to the bottom interconnect structure of the bottom wafer. An oxide-nitride-oxide (ONO) dielectric layer covers the rear surface of the top substrate. A plurality of conductive vias is disposed on the rear surface and extending into the ONO dielectric layer and the top substrate.

20 Claims, 6 Drawing Sheets

(51) Int. Cl.

| | |
|---|---|
| *H01L 29/40* | (2006.01) |
| *H10W 20/00* | (2026.01) |
| *H10W 20/20* | (2026.01) |
| *H10W 90/00* | (2026.01) |
| *H10W 72/90* | (2026.01) |
| *H10W 80/00* | (2026.01) |
| *H10W 90/20* | (2026.01) |

(52) U.S. Cl.
CPC ........ *H10W 72/952* (2026.01); *H10W 80/327* (2026.01); *H10W 90/297* (2026.01)

(58) Field of Classification Search
CPC ........... H10W 72/9223; H10W 80/333; H10W 90/764; H10W 90/725
See application file for complete search history.

1

1

SEMICONDUCTOR STRUCTURE AND FABRICATION METHOD THEREOF

BACKGROUND OF THE INVENTION

1. Field of the Invention

The present invention relates to the field of semiconductor technology, and in particular to an improved semiconductor structure suitable for use in the field of wafer hybrid bonding technology.

2. Description of the Prior Art

Three-dimensional integrated circuits (3D IC) have been generally acknowledged as the next generation semiconductor technology with the advantages of small form factor, high-performance, low power consumption, and high density integration. Through silicon via (TSV) and stacked bonding are the core technologies to perform vertical interconnect for 3D integration.

Chip-to-wafer and wafer-to-wafer hybrid bonding can be used to connect chips using direct, copper-to-copper bonds that enable the combined elements to perform as one. Hybrid bonding is the industry's most advanced technology in production today, improving throughput and power by packing more wiring into smaller spaces and reducing the distances signals need to travel.

TSVs are vertical wires used to precisely connect stacked chips. They are formed by etching trenches into silicon and then filling them with insulating liners and metal wires. As designers continue to integrate more logic, memory and specialty chips into advanced 2.5D and 3D packages, the number of TSV interconnects has expanded from a few hundred per package to thousands. To integrate more interconnects and accommodate taller stacks of chips, designers need the vias to become increasingly narrow and tall, which results in deposition uniformity variations that degrade performance and increase resistance and power consumption.

SUMMARY OF THE INVENTION

One object of the present invention is to provide an improved semiconductor structure and a manufacturing method thereof, which are suitable for the field of wafer hybrid bonding technology to solve the deficiencies or shortcomings of the existing technology.

One aspect of the invention provides a semiconductor structure including a bottom wafer comprising a bottom substrate and a bottom interconnect structure on the bottom substrate; a top wafer having a top substrate with a front surface and a rear surface, and a top interconnect structure disposed on the front surface of the top substrate, wherein the top interconnect structure is directly bonded to the bottom interconnect structure of the bottom wafer; an oxide-nitride-oxide (ONO) dielectric layer covering the rear surface of the top substrate; and a plurality of conductive vias disposed on the rear surface and extending into the ONO dielectric layer and the top substrate.

According to some embodiments, the top substrate comprises a silicon substrate and has a thickness of about 3-5 micrometers.

According to some embodiments, the plurality of conductive vias is electrically connected to the top interconnect structure disposed on the front surface of the top substrate.

According to some embodiments, the plurality of conductive vias comprises copper or aluminum.

According to some embodiments, the plurality of conductive vias has a top surface that is coplanar with a top surface of the ONO dielectric layer.

According to some embodiments, the bottom wafer has a first vertical sidewall and the top wafer has a second vertical sidewall, and wherein the first vertical sidewall is flush with the second vertical sidewall.

According to some embodiments, the bottom wafer has an edge portion that protrudes from the first vertical sidewall.

According to some embodiments, the first vertical sidewall and the second vertical sidewall are covered with a protective layer.

According to some embodiments, the protective layer extends onto an upper surface of the edge portion.

According to some embodiments, the protective layer comprises silicon oxide

Another aspect of the invention provides a method of forming a semiconductor structure. A bottom wafer comprising a bottom substrate and a bottom interconnect structure on the bottom substrate is provided. A top wafer having a top substrate with a front surface and a rear surface, and a top interconnect structure disposed on the front surface of the top substrate is provided. The top interconnect structure is directly bonded to the bottom interconnect structure of the bottom wafer. An oxide-nitride-oxide (ONO) dielectric layer is formed to cover the rear surface of the top substrate. After forming the ONO dielectric layer, a plurality of conductive vias is formed on the rear surface and extending into the ONO dielectric layer and the top substrate.

According to some embodiments, the top substrate comprises a silicon substrate and has a thickness of about 3-5 micrometers.

According to some embodiments, the plurality of conductive vias is electrically connected to the top interconnect structure disposed on the front surface of the top substrate.

According to some embodiments, the plurality of conductive vias comprises copper or aluminum.

According to some embodiments, the plurality of conductive vias has a top surface that is coplanar with a top surface of the ONO dielectric layer.

According to some embodiments, the bottom wafer has a first vertical sidewall and the top wafer has a second vertical sidewall, and wherein the first vertical sidewall is flush with the second vertical sidewall.

According to some embodiments, the bottom wafer has an edge portion that protrudes from the first vertical sidewall.

According to some embodiments, the first vertical sidewall and the second vertical sidewall are covered with a protective layer.

According to some embodiments, the protective layer extends onto an upper surface of the edge portion.

According to some embodiments, the protective layer comprises silicon oxide.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
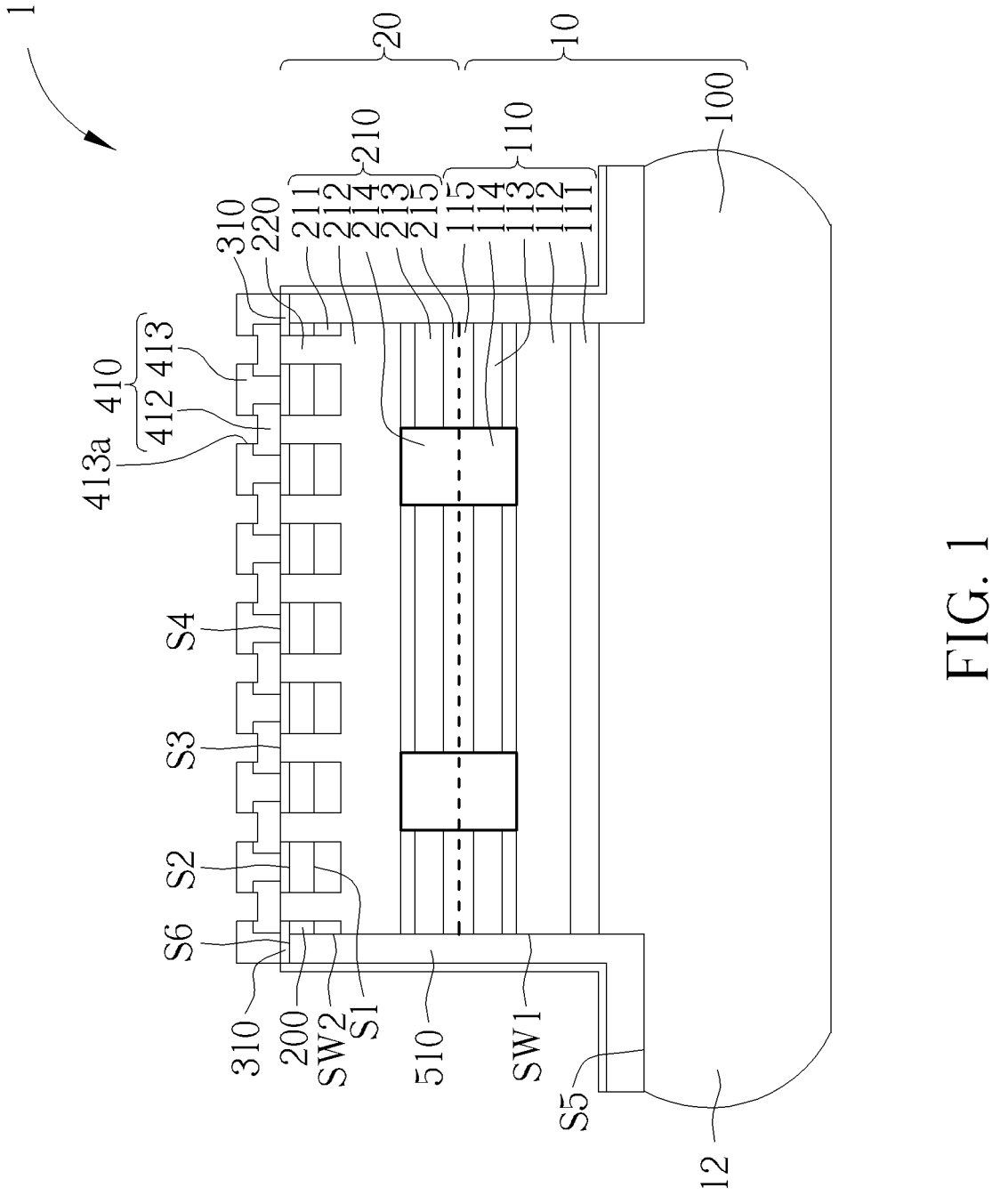
FIG. 1 is a schematic cross-sectional view of a semiconductor structure according to an embodiment of the present invention.

Please refer to FIG. 1, which is a schematic cross-sectional view of a semiconductor structure according to an embodiment of the present invention. As shown in FIG. 1, the semiconductor structure 1 includes a bottom wafer 10 and a top wafer 20, which are directly bonded together. According to an embodiment of the present invention, the bottom wafer 10 includes a bottom substrate 100 and a bottom interconnect structure 110 located on the bottom substrate 100. According to an embodiment of the present invention, the bottom substrate 100 may be, for example, a silicon substrate, but is not limited thereto. According to an embodiment of the present invention, the top wafer 20 includes a top substrate 200 having a front surface S1 and a rear surface S2, and a top interconnect structure 210 disposed on the front surface S1 of the top substrate 200. According to an embodiment of the present invention, the top substrate 200 may be, for example, a silicon substrate, but is not limited thereto. According to an embodiment of the present invention, the thickness of the top substrate 200 is 3-5 micrometers.

According to an embodiment of the present invention, for example, the bottom interconnect structure 110 may include, but is not limited to, a dielectric layer 111, a metal layer 112, a dielectric layer 113, a bonding copper pad 114, and a bonding dielectric layer 115. According to an embodiment of the present invention, for example, the dielectric layers 111 and 113 may include a silicon oxide layer, a silicon oxynitride layer, a silicon nitride layer, a low dielectric constant material layer or an ultra-low dielectric constant layer, etc. According to an embodiment of the present invention, for example, the dielectric layer 115 may include a silicon oxide layer, but is not limited thereto. According to an embodiment of the present invention, for example, the metal layer 112 may include copper, tungsten, titanium, tantalum, aluminum, gold, etc., but is not limited thereto.

Those skilled in the art should understand that circuit elements, such as transistors, etc., may be formed in the bottom substrate 100. For the sake of simplicity, these circuit elements are not shown in the figures.

According to an embodiment of the present invention, for example, the top interconnect structure 210 may include, but is not limited to, a dielectric layer 211, a metal layer 212, a dielectric layer 213, a bonding copper pad 214, and a bonding dielectric layer 215. According to an embodiment of the present invention, for example, the dielectric layers 211 and 213 may include a silicon oxide layer, a silicon oxynitride layer, a silicon nitride layer, a low dielectric constant material layer or an ultra-low dielectric constant layer, etc. According to an embodiment of the present invention, for example, the dielectric layer 215 may include a silicon oxide layer, but is not limited thereto. According to an embodiment of the present invention, for example, the metal layer 212 may include copper, tungsten, titanium, tantalum, aluminum, gold, etc., but is not limited thereto.

Those skilled in the art should understand that circuit elements, such as transistors, may also be formed in the bottom substrate 200. For the sake of simplicity, these circuit elements are not shown in the figures.

According to an embodiment of the present invention, the bottom wafer 10 and the top wafer 20 may be bonded together through hybrid bonding technology. According to an embodiment of the present invention, the top interconnect structure 210 of the top wafer 20 is directly bonded to the bottom interconnect structure 110 of the bottom wafer 10. More specifically, the bottom wafer 10 is directly bonded to the top wafer 20 by aligning and bonding the bonding copper pads 114 with the bonding copper pads 214 and directly bonding the bonding dielectric layer 115 with the bonding dielectric layer 215.

According to an embodiment of the present invention, the semiconductor structure 1 further includes an oxide-nitride-oxide (ONO) dielectric layer 310 covering the rear surface S2 of the top substrate 200. According to an embodiment of the present invention, a metal connection structure 410 is formed on the ONO dielectric layer 310. According to an embodiment of the present invention, for example, the metal connection structure 410 may include a metal wiring layer 412 and a dielectric layer 413. According to an embodiment of the present invention, for example, the metal wiring layer 412 may include metal pads, and the dielectric layer 413 may include an opening 413a, exposing a portion of the metal wiring layer 412.

According to an embodiment of the present invention, the semiconductor structure 1 further includes a plurality of conductive vias 220, which are disposed on the rear surface S2 of the top substrate 200, and are electrically connected to the metal wiring layer 412. The plurality of conductive vias 220 extends downwardly into the ONO dielectric layer 310 and the top substrate 200. According to an embodiment of the present invention, the plurality of conductive vias 220 is electrically connected to the top interconnect structure 210 disposed on the front surface S1 of the top substrate 200. According to an embodiment of the present invention, the plurality of conductive vias 220 includes copper or aluminum. According to an embodiment of the present invention, the top surface S3 of the plurality of conductive vias 220 is coplanar with the top surface S4 of the ONO dielectric layer 310.

According to an embodiment of the present invention, the bottom wafer 10 has a first vertical sidewall SW1, and the top wafer 20 has a second vertical sidewall SW2. The first vertical sidewall SW1 and the second vertical sidewall SW2 are aligned and coplanar in the vertical direction. According to an embodiment of the present invention, the bottom wafer 10 has an edge portion 12 protruding from the first vertical sidewall SW1. According to an embodiment of the present invention, the first vertical sidewall SW1 and the second vertical sidewall SW2 are covered with a protective layer 510. According to an embodiment of the invention, the protective layer 510 extends onto the upper surface S5 of the edge portion 12. According to an embodiment of the present invention, for example, the protective layer 510 may include silicon oxide, but is not limited thereto. According to an embodiment of the present invention, the ONO dielectric layer 310 may directly contact the top surface S6 of the protective layer 510.

Figure 2:
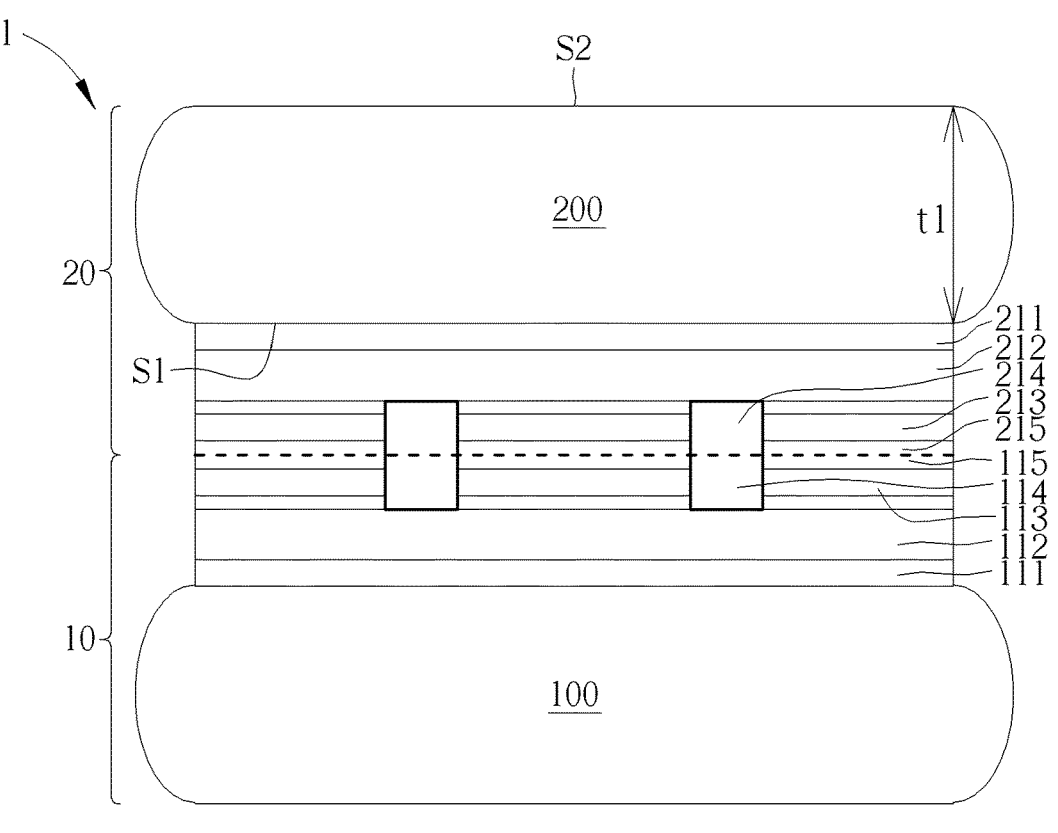
FIG. 2 to FIG. 10 illustrate a method of forming a semiconductor structure.

Please refer to FIG. 2 to FIG. 10, which illustrate a method of forming a semiconductor structure 1 according to an embodiment of the present invention. As shown in FIG. 2, a bottom wafer 10 and a top wafer 20 are provided, and the bottom wafer 10 and the top wafer 20 are directly bonded together using hybrid bonding technology. According to an embodiment of the present invention, the bottom wafer 10 includes a bottom substrate 100 and a bottom interconnect structure 110 located on the bottom substrate. According to an embodiment of the present invention, the bottom substrate 100 may be, for example, a silicon substrate, but is not limited thereto. According to an embodiment of the present invention, the top wafer 20 includes a top substrate 200 having a front surface S1 and a rear surface S2, and a top interconnect structure 210 disposed on the front surface S1 of the top substrate 200. At this point, the top substrate 200 has a first thickness t1, for example, 700-800 micrometers. No through silicon vias (TSVs) are formed in the top substrate 200.

According to an embodiment of the present invention, for example, the bottom interconnect structure 110 may include, but is not limited to, a dielectric layer 111, a metal layer 112, a dielectric layer 113, a bonding copper pad 114, and a bonding dielectric layer 115. According to an embodiment of the present invention, for example, the dielectric layers 111 and 113 may include a silicon oxide layer, a silicon oxynitride layer, a silicon nitride layer, a low dielectric constant material layer or an ultra-low dielectric constant layer, etc. According to an embodiment of the present invention, for example, the dielectric layer 115 may include a silicon oxide layer, but is not limited thereto. According to an embodiment of the present invention, for example, the metal layer 112 may include copper, tungsten, titanium, tantalum, aluminum, gold, etc., but is not limited thereto.

According to an embodiment of the present invention, for example, the top interconnect structure 210 may include, but is not limited to, a dielectric layer 211, a metal layer 212, a dielectric layer 213, a bonding copper pad 214, and a bonding dielectric layer 215. According to an embodiment of the present invention, for example, the dielectric layers 211 and 213 may include a silicon oxide layer, a silicon oxynitride layer, a silicon nitride layer, a low dielectric constant material layer or an ultra-low dielectric constant layer, etc. According to an embodiment of the present invention, for example, the dielectric layer 215 may include a silicon oxide layer, but is not limited thereto. According to an embodiment of the present invention, for example, the metal layer 212 may include copper, tungsten, titanium, tantalum, aluminum, gold, etc., but is not limited thereto.

Figure 3:
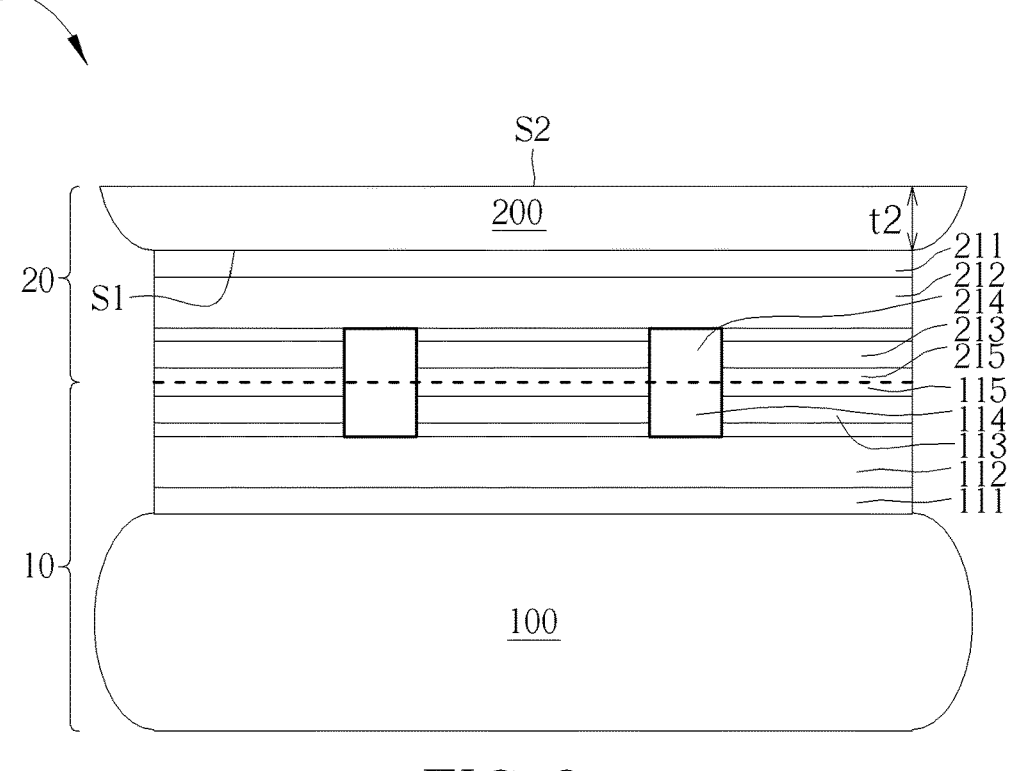

As shown in FIG. 3, a first wafer grinding process is then performed on the rear surface S2 of the top substrate 200. At this point, the polished top substrate 200 has a second thickness t2, for example, 200-300 micrometers, for example, 250 micrometers.

Figure 4:
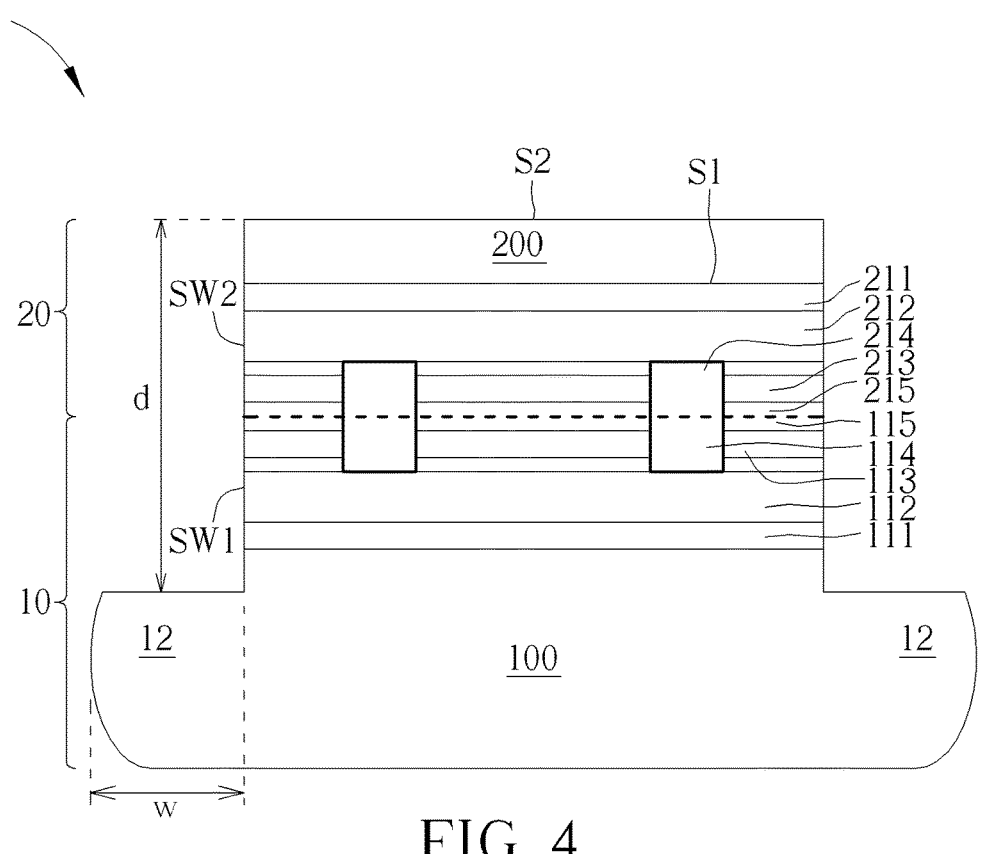

As shown in FIG. 4, a photolithography process and an etching process are then performed to remove the entire thickness of the bottom wafer 10 and part of the thickness of the top wafer 20 in an annular peripheral area. According to an embodiment of the present invention, for example, the width w of the above-mentioned annular peripheral area is approximately 2.8 mm, and the depth d is approximately 290 micrometers. According to an embodiment of the present invention, the bottom wafer 100 has a first vertical sidewall SW1, and the top wafer 20 has a second vertical sidewall SW2. The first vertical sidewall SW1 and the second vertical sidewall SW2 are aligned and coplanar in the vertical direction. Furthermore, the bottom wafer has an annular edge portion 12 protruding from the first vertical sidewall SW1.

Figure 5:
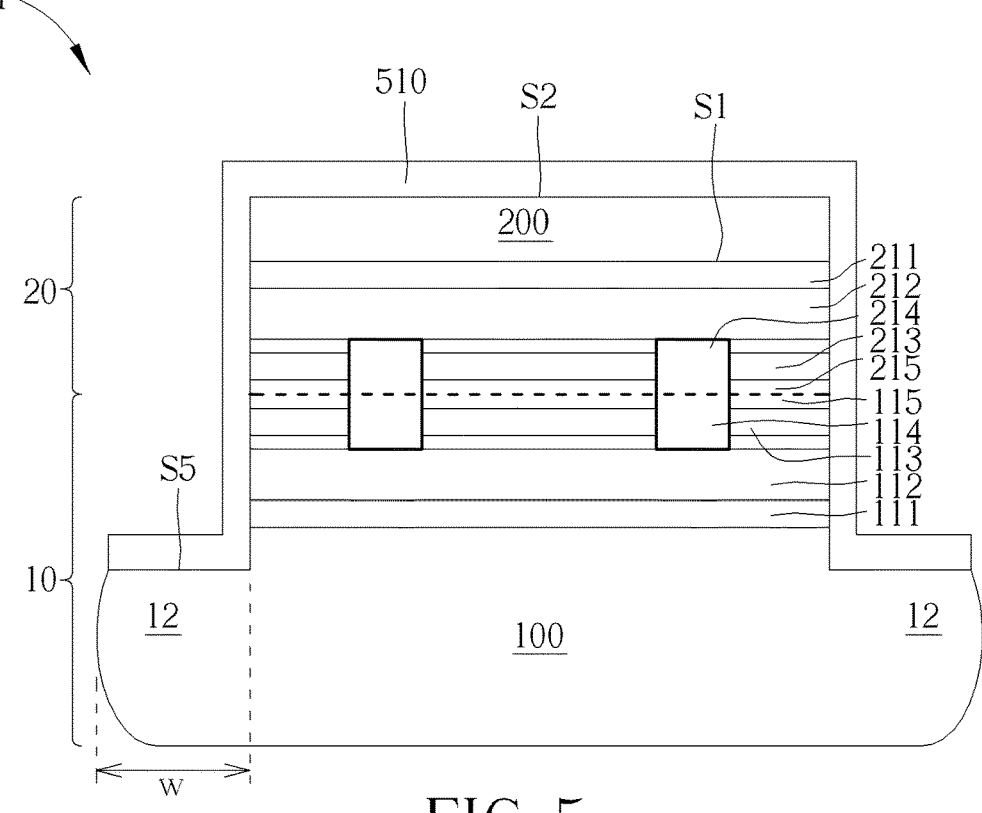

As shown in FIG. 5, a chemical vapor deposition process is then performed to conformally deposit a protective layer 510 on the rear surface S2 of the top substrate 200, the first vertical sidewall SW1 of the bottom wafer 100, the second vertical sidewall SW2 of the top wafer 20, and the upper surface S5 of the annular edge portion 12. According to an embodiment of the present invention, for example, the protective layer 510 includes silicon oxide, but is not limited thereto.

Figure 6:
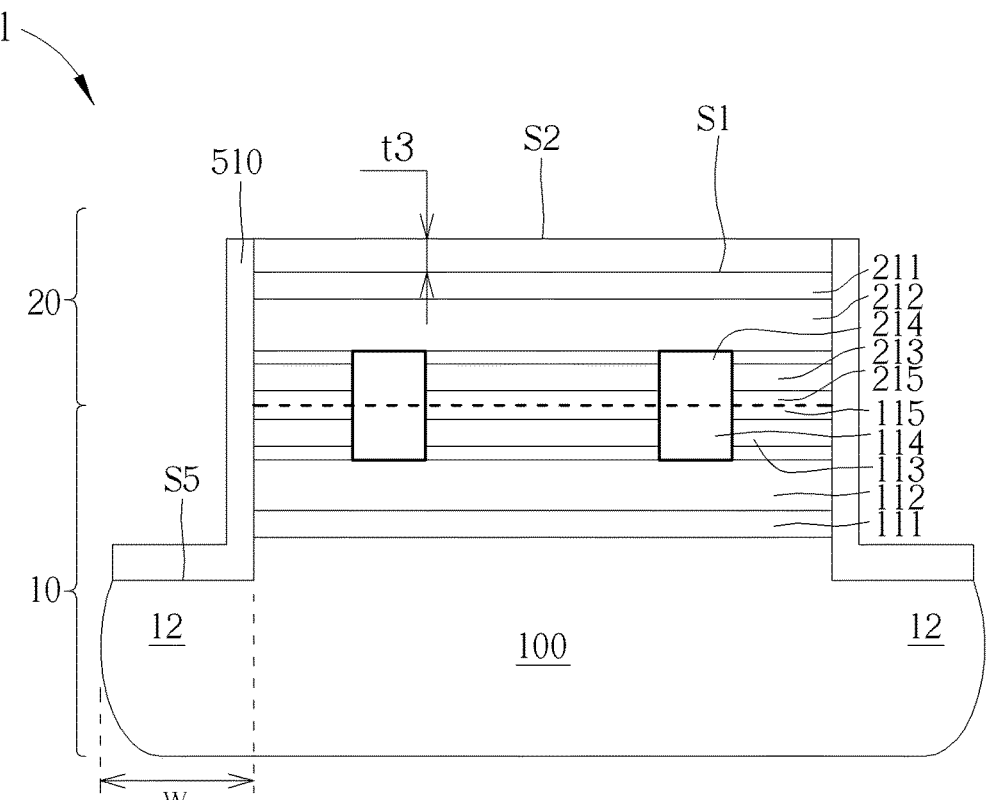

As shown in FIG. 6, a second wafer grinding process is then performed on the rear surface S2 of the top substrate 200. At this point, the polished top substrate 200 has a third thickness t3, for example, 10-30 micrometers. The protective layer 510 originally located on the rear surface S2 of the top substrate 200 is also removed, leaving only the protective layer 510 on the first vertical sidewall SW1 of the bottom wafer 100, the second vertical sidewall SW2 of the top wafer 20, and the upper surface S5 of the annular edge portion 12.

Figure 7:
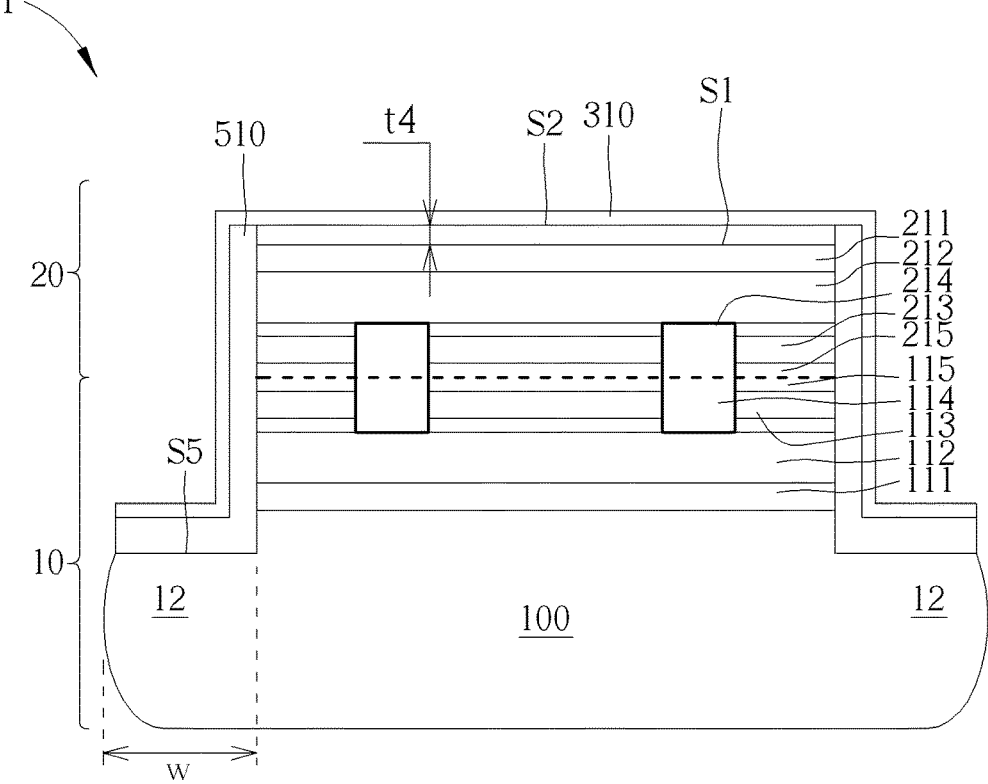

As shown in FIG. 7, a chemical mechanical polishing process is performed to thin the thickness of the top substrate 200 to a fourth thickness t4, for example, 3-5 micrometers. Subsequently, a chemical vapor deposition process is performed to conformally deposit an oxide-nitride-oxide (ONO) dielectric layer 310 on the top substrate 200 and the protective layer 510.

Figure 8:
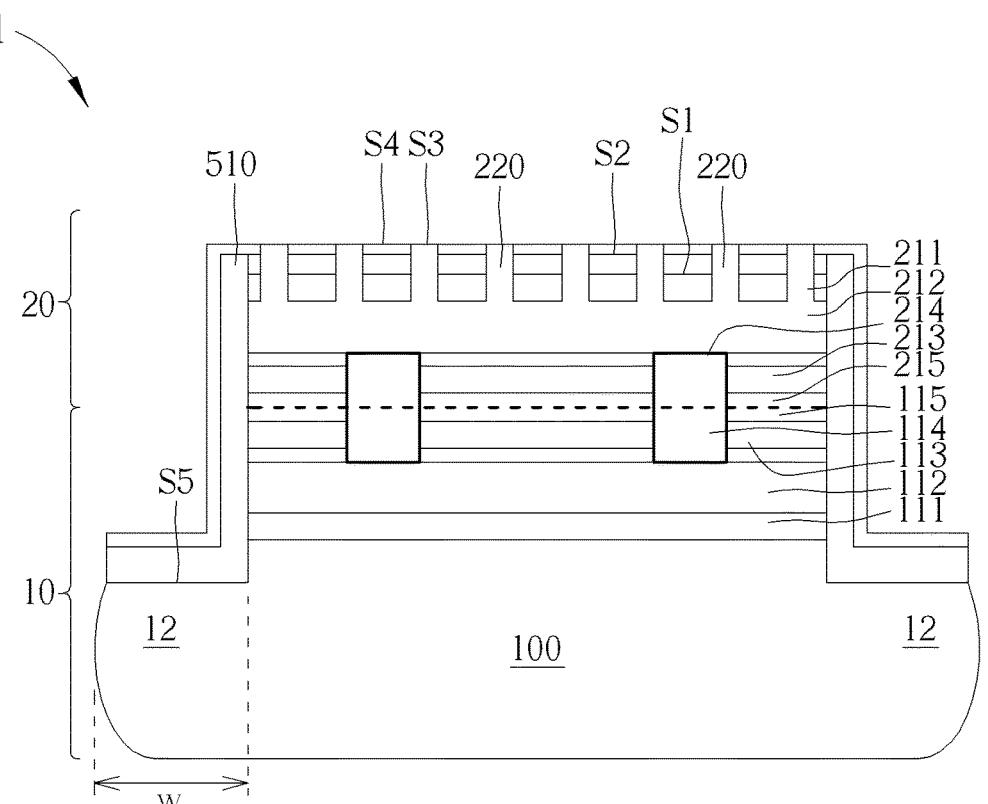

As shown in FIG. 8, after the ONO dielectric layer 310 is formed, a plurality of conductive vias 220 are formed on the rear surface S2 of the top substrate 200 so that the plurality of conductive vias 220 extend into the ONO dielectric layer 310 and the top substrate 200. According to an embodiment of the present invention, the plurality of conductive vias 220 is electrically connected to the top interconnect structure 210 disposed on the front surface S1 of the top substrate 200. According to an embodiment of the present invention, the plurality of conductive vias 220 includes, for example, copper or aluminum, but not limited thereto. According to an embodiment of the present invention, at this point, the top surface S3 of the plurality of conductive vias 220 is coplanar with the top surface S4 of the ONO dielectric layer 310.

Figure 9:
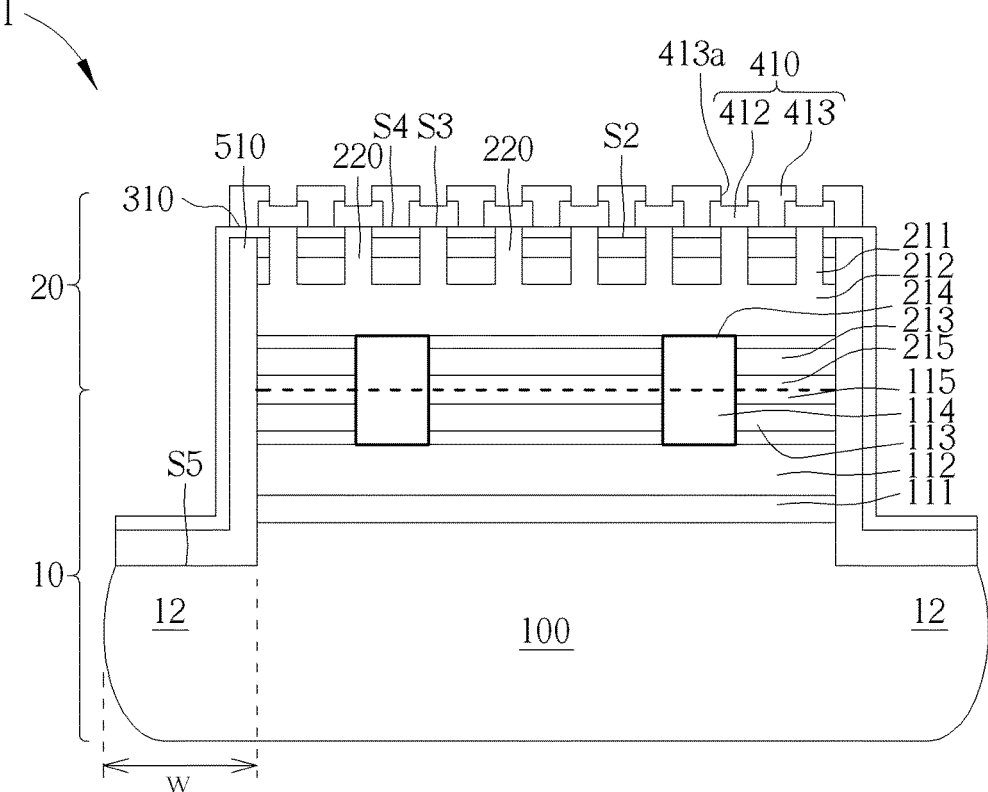

As shown in FIG. 9, a metallization process is then performed to form a metal connection structure 410 on the ONO dielectric layer 310. According to an embodiment of the present invention, for example, the metal connection structure 410 may include a metal wiring layer 412 and a dielectric layer 413. According to an embodiment of the present invention, for example, the metal wiring layer 412 may include metal pads, and the dielectric layer 413 may include an opening 413a, exposing a portion of the metal wiring layer 412.

Figure 10:
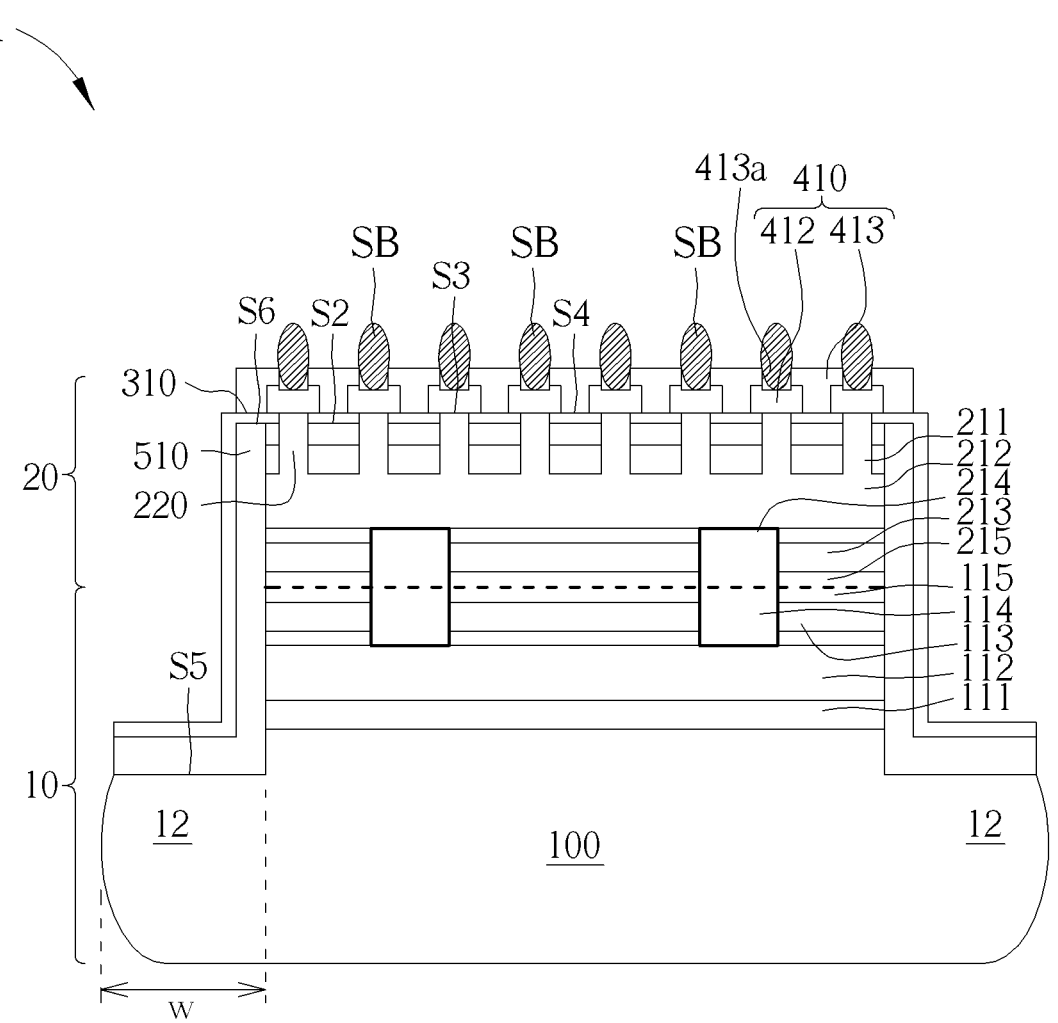

Finally, as shown in FIG. 10, conductive elements SB, such as solder balls, bumps or micro-bumps, may be formed on the metal connection structure 410, but are not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a bottom wafer comprising a bottom substrate and a bottom interconnect structure on the bottom substrate;

a top wafer having a top substrate with a front surface and a rear surface, and a top interconnect structure disposed on the front surface of the top substrate, wherein the top interconnect structure is directly bonded to the bottom interconnect structure of the bottom wafer;

an oxide-nitride-oxide (ONO) dielectric layer covering the rear surface of the top substrate; and a plurality of conductive vias disposed on the rear surface and extending into the ONO dielectric layer and the top substrate.

2. The semiconductor structure according to claim 1, wherein the top substrate comprises a silicon substrate and has a thickness of about 3-5 micrometers.

3. The semiconductor structure according to claim 1, wherein the plurality of conductive vias are electrically connected to the top interconnect structure disposed on the front surface of the top substrate.

4. The semiconductor structure according to claim 1, wherein the plurality of conductive vias comprise copper or aluminum.

5. The semiconductor structure according to claim 1, wherein the plurality of conductive vias has a top surface that are coplanar with a top surface of the ONO dielectric layer.

6. The semiconductor structure according to claim 1, wherein the bottom wafer has a first vertical sidewall and the top wafer has a second vertical sidewall, and wherein the first vertical sidewall is flush with the second vertical sidewall.

7. The semiconductor structure according to claim 6, wherein the bottom wafer has an edge portion that protrudes from the first vertical sidewall.

8. The semiconductor structure according to claim 7, wherein the first vertical sidewall and the second vertical sidewall are covered with a protective layer.

9. The semiconductor structure according to claim 8, wherein the protective layer extends onto an upper surface of the edge portion.

10. The semiconductor structure according to claim 8, wherein the protective layer comprises silicon oxide.

11. A method of forming a semiconductor structure, comprising:

providing a bottom wafer comprising a bottom substrate and a bottom interconnect structure on the bottom substrate;

providing a top wafer having a top substrate with a front surface and a rear surface and a top interconnect structure disposed on the front surface of the top substrate, wherein the top interconnect structure is directly bonded to the bottom interconnect structure of the bottom wafer;

forming an oxide-nitride-oxide (ONO) dielectric layer covering the rear surface of the top substrate; and after forming the ONO dielectric layer, forming a plurality of conductive vias on the rear surface and extending into the ONO dielectric layer and the top substrate.

12. The method according to claim 11, wherein the top substrate comprises a silicon substrate and has a thickness of about 3-5 micrometers.

13. The method according to claim 11, wherein the plurality of conductive vias are electrically connected to the top interconnect structure disposed on the front surface of the top substrate.

14. The method according to claim 11, wherein the plurality of conductive vias comprise copper or aluminum.

15. The method according to claim 11, wherein the plurality of conductive vias have a top surface that is coplanar with a top surface of the ONO dielectric layer.

16. The method according to claim 11, wherein the bottom wafer has a first vertical sidewall and the top wafer has a second vertical sidewall, and wherein the first vertical sidewall is flush with the second vertical sidewall.

17. The method according to claim 16, wherein the bottom wafer has an edge portion that protrudes from the first vertical sidewall.

18. The method according to claim 17, wherein the first vertical sidewall and the second vertical sidewall are covered with a protective layer.

19. The method according to claim 18, wherein the protective layer extends onto an upper surface of the edge portion.

20. The method according to claim 18, wherein the protective layer comprises silicon oxide.

* * * * *